United States Patent
De Gruyter et al.

(10) Patent No.: US 6,525,526 B1
(45) Date of Patent: Feb. 25, 2003

(54) METHOD AND DEVICE FOR TESTING PRINTED CIRCUIT BOARDS

(75) Inventors: Falko De Gruyter, Wunstorf (DE); Hans-Hermann Higgen, Stadthagen (DE)

(73) Assignee: Luther & Maelzer GmbH, Wunstorf (DE)

( * ) Notice: Subject to any disclaimer, the term of this patent is extended or adjusted under 35 U.S.C. 154(b) by 0 days.

(21) Appl. No.: 09/601,670

(22) PCT Filed: Feb. 10, 1999

(86) PCT No.: PCT/EP99/00873
§ 371 (c)(1),
(2), (4) Date: Sep. 19, 2000

(87) PCT Pub. No.: WO99/42850
PCT Pub. Date: Aug. 26, 1999

(30) Foreign Application Priority Data

Feb. 18, 1998 (DE) .......................................... 198 06 830
May 12, 1998 (DE) .......................................... 198 21 225

(51) Int. Cl.$^7$ .................................................. H01H 31/02
(52) U.S. Cl. .................................... 324/158.1; 324/537
(58) Field of Search .............................. 324/158.1, 538, 324/754, 765, 408, 537, 628, 763; 702/117, 118; 361/189

(56) References Cited

U.S. PATENT DOCUMENTS

| | | | |
|---|---|---|---|
| 4,724,377 A | 2/1988 | Maelzer et al. | 324/73 PC |
| 5,032,789 A | 7/1991 | Firooz et al. | 324/158 R |
| 5,412,313 A | 5/1995 | Martin | 324/158.1 |
| 5,457,380 A * | 10/1995 | Blumenau | 324/158.1 |
| 5,661,409 A * | 8/1997 | Mohsen | 324/765 |
| 6,124,715 A * | 9/2000 | Chakravorty | 324/537 |

FOREIGN PATENT DOCUMENTS

| | | |
|---|---|---|
| DE | 40 09 296 A1 | 9/1991 |
| EP | 108 405 A1 | 5/1984 |
| JP | 08-136614 | 5/1996 |

OTHER PUBLICATIONS

International Search Report for PCT/EP99/00873 dated Jun. 4, 1999.
International Preliminary Examination Report for PCT/EP99/00873 dated Feb. 18, 1998.

* cited by examiner

Primary Examiner—Michael Sherry
Assistant Examiner—Trung Nguyen
(74) Attorney, Agent, or Firm—Marshall, Gerstein & Borun

(57) ABSTRACT

Printed circuit boards are tested in accordance with a method in which the circuit boards (1) are brought into contact with conducting test-contact elements (5) at certain contact points (3) which are connected to the conductor tracks (2), the test-contact elements (5) or a partial number thereof are connected, in succession in clock-pulsed manner according to a certain test program, to a test-voltage source (8) and during each test clock pulse the flowing via the test-contact elements (5) or a parameter related thereto is measured. Particularly for circuit boards (1) to be tested having a high contact-point density, the testing-time can be shortened by the circuit boards being subdivided into a plurality of test areas and all or at least some of the test areas being tested in parallel. The method is especially suitable for circuit boards that are produced in a multiple panel.

4 Claims, 5 Drawing Sheets

METHOD AND DEVICE FOR TESTING PRINTED CIRCUIT BOARDS

This is the U.S. national phase of International Application No. PCT/EP99/00873 filed Feb. 10, 1999, the entire disclosure of which is incorporared herein by reference.

BACKGROUND OF THE INVENTION

1. Field of the Invention

The invention relates to a method for testing printed circuit boards, wherein the circuit boards are brought into contact with conducting test-contact elements at certain contact points which are connected to the conductor tracks, wherein the test-contact elements or a partial number thereof are connected, in succession in clock-pulsed manner according to a certain test program, to a source of test voltage and wherein during each test clock pulse the test current flowing via the test-contact elements or a parameter related thereto is measured.

2. Description of the Related Art

The contact points on circuit boards serve to make contact with electronic components and are, as a rule, arranged in a definite grid. The test-contact elements are also set in accordance with this grid. Said test-contact elements may be realised by means of test pins, but they may also be realised in some other way, for example by means of an elastic layer of rubber which rests on the circuit board and which is provided with graphite-bead inserts. Said rubber layer is conducting at the contact points if it is pressed together at these points.

As a result of the tendency to make electronic components smaller and smaller and to increase the packaging density, with respect to circuit boards there is also a requirement to set the grid of the contact points so as to make them closer and closer together. Although, as a result, the circuit boards that are intended for use in electrical appliances are, as a rule, becoming smaller in their dimensions, this reduction is size is utilised optimally in the course of manufacture in such a way that several basic patterns or panels are provided on an initial circuit board. The initial circuit board is tested as a unit and is only separated into single elements later.

The ever increasing density of contact points on circuit boards to be tested has the consequence that the number of measurements to be carried out in the course of testing is becoming correspondingly larger.

Great efforts have been made hitherto to shorten, to an ever more acute degree, the mechanical time for the interchange of circuit boards to be tested. The constructional provision for the purpose of realising short interchange-times has meanwhile become considerable. From this point of view it is unsatisfactory if the ratio of the measuring-time to the interchange-time keeps on increasing, so that the cycle time resulting from the sum of the two times is ultimately substantially determined by the measuring-time, and the technical provision for the purpose of shortening the interchange-time no longer seems justified.

SUMMARY OF THE INVENTION

The object underlying the invention is therefore to shorten the measuring-time.

Proceeding from the method described at the outset, the solution consists in subdividing the circuit boards into a plurality of test areas, each of which contains only a partial number of contact points, and in all or at least some of the test areas being tested in parallel.

To the extent that the initial circuit board has been conceived in a multiple panel, it makes sense to provide a number of test areas that is equal to the number of panels, with each test area containing the conductor tracks of one panel. An example of this is shown in FIG. 1. An advantage in this case is the fact that the measuring-time is of equal length for all panels. Each test area can be tested, for example, in such a way that the contact points bounding a conductor track are connected in succession in clock-pulsed manner to the test-voltage source, and it is established by measurement of the flow of current whether the conductor tracks possibly exhibit an interruption fault. After this, in each instance a contact point, on the one hand, and all the remaining contact points that are not connected to this contact point by a conductor track, on the other hand, are connected in succession in clock-pulsed manner to the test-voltage source, in order to establish whether the conductor track that is connected to the contact point possibly has an undesirable contact with other conductor tracks and to this extent exhibits an insulation fault. As an alternative to this, it is also possible to test a panel firstly for interruption faults in the course of the parallel testing and to begin the testing for insulation faults in the course of testing another panel.

It is by no means necessary for the test areas to be laid down in such a way that they contain only conductor tracks extending within these test areas. Instead, the boundaries of the test areas can also be laid down in such a way that they pass straight through conductor tracks, so that the conductor tracks are, to a certain extent, area-overlapping. This is useful in particular when the boundary of the panel extends in the same way and the area-overlapping conductor tracks are likewise separated after separation of the initial circuit board into individual panels. An example of this is shown in FIG. 4. But care has to be taken here to ensure that in the course of the parallel testing the area-overlapping conductor tracks do not have test voltage applied to them simultaneously from both sides. This can be guaranteed by an appropriate design of the test program (algorithm). Normally it is also possible to dispense with testing such area-overlapping conductor tracks for interruption faults, since—as already mentioned—the conductor tracks are separated in any case.

The teaching according to the invention is by no means tied to laying down the area boundaries always in conformity with the boundaries of the panel. Rather it is to be understood in all generality and may also find application when a circuit board to be tested has merely a high contact-point density without a basic pattern being repeated several times in the form of panels.

The invention further relates to a device for implementing the method described above. The device has to contain, in known manner, a plurality of test-contact elements intended for contacting the contact points of the conductor tracks, furthermore a source of test voltage, program control means, variable connecting means that are capable of being switched over by the program control means in such a way that the test-contact elements are connected individually or in groups, in succession in clock-pulsed manner according to a certain test program, to the test-voltage source and evaluating means that measure and evaluate the flow of current through the test-contact elements or a parameter related thereto.

In order to be able to realise parallel measurements of the individual test areas, in accordance with the invention at least some of the hardware described above has to be multiplied so as to correspond to the number of test areas. In practice this means that at least the evaluating means for implementing a parallel testing of test areas have to be provided in multiple number.

Overall, with reference to the parallel testing it is to be noted that the following two conditions have to be satisfied:

1. The tests have to be undertaken independently of one another, and one testing operation must not have to wait for the result of the other testing operation. In other words, this means that the result of measurement of one test area must not be a basis for the measurement in another test area.
2. The same resources must not be used for the parallel testing. In practice this means that the hardware that is necessary for the measurement or evaluation has to be available in multiple configuration.

With a view to implementing the method according to the invention there is also the possibility of realising the individual test areas by means of test modules which are arranged side by side in known manner, as described in EP-B1 0 108 405 for example. The starting-point for the state of the art according to this patent specification is that the possessor of a testing device is able to extend his test bench arbitrarily by additional purchase of modules. The concept of causing the modules to operate autonomously in parallel is not present in this printed publication. Rather they are intended to operate together like a single large module in such a manner that it is possible to perform a test between very remote test points, even in the case of very large circuit boards.

Proceeding from the state of the art as described above, a device having several test modules arranged side by side is accordingly known for testing printed circuit boards, each of said test modules being connected to a plurality of conducting test-contact elements that are capable of being connected with contact points on the circuit boards in accordance with a certain test program.

If the inventive idea of parallel testing as elucidated above is applied to this known device, this results in the teaching to design the test program in such a way that the test modules test the test areas of the circuit boards assigned spatially to them simultaneously and independently of one another.

BRIEF DESCRIPTION OF THE DRAWINGS

Examples of embodiments of the invention will be described in the following on the basis of the drawings. Shown in the latter are.

DETAILED DESCRIPTION OF THE DRAWINGS

Figure 1:
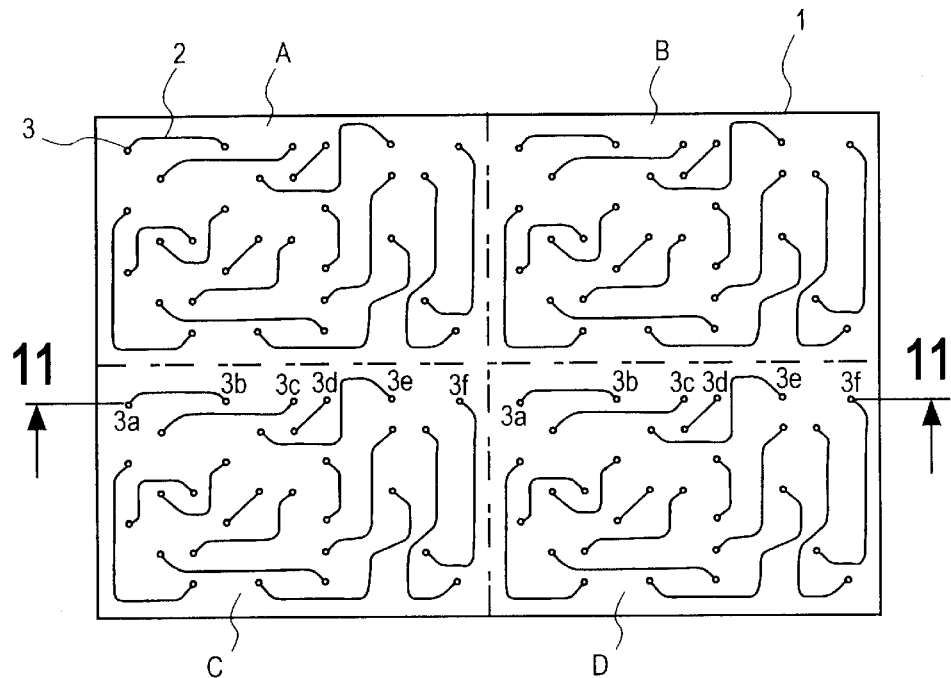
FIG. 1 the top view of an initial circuit board to be tested, with four panels.

FIG. 1 shows an initial circuit board 1 to be tested which consists of four panels A, B, C and D. Each panel is provided with the same pattern of conductor tracks 2 and contact points 3, the contact points here being arranged in a grid. The contact points 3 serve for contacting electronic components (not represented).

Figure 2:
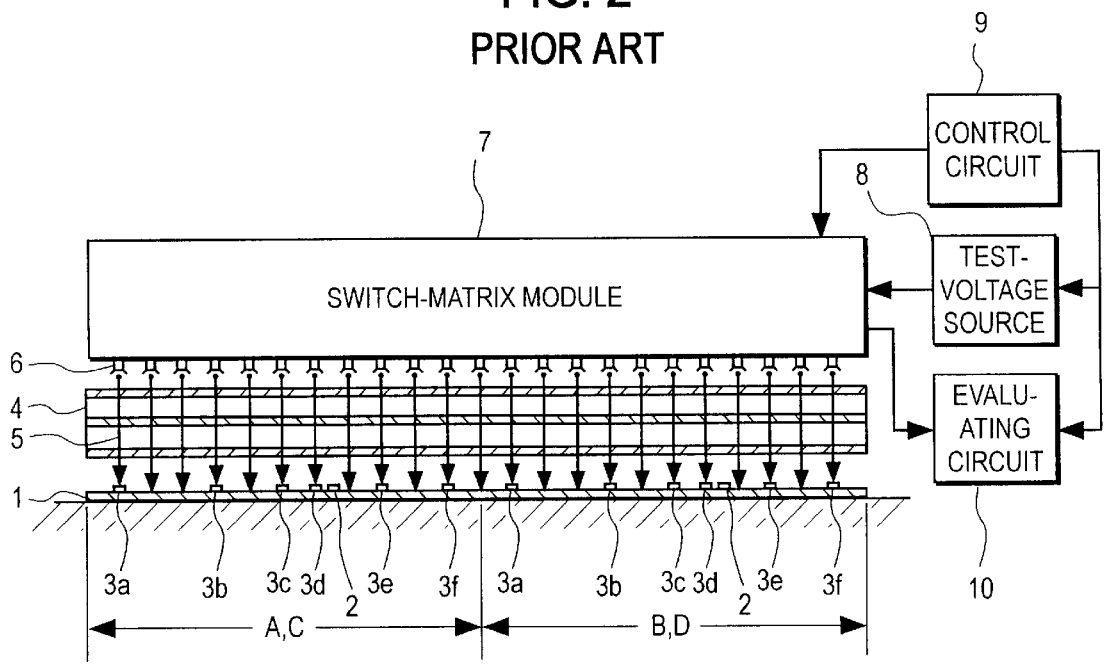
FIG. 2 a section II—II through the initial circuit board with a schematically represented testing device, by means of which the circuit board can be tested in conventional manner.

FIG. 2 shows the circuit board 1 in a section II—II. The contact points 3a, 3b, 3c, 3d, 3e and 3f of the two panels C and D are included by this section. The circuit board 1 here is located in a testing device which—since it is known as such—is drawn only in schematised manner.

The testing device includes an adapter 4 which is arranged above the circuit board 1 and consists, for example, of three boards spaced from one another which are provided with feed-through holes for test pins 5. The test pins 5 consist of metal. They comprise a test probe on their side facing the circuit board 1 and come into contact at their end facing away from the circuit board 1 with corresponding mating contacts 6 of a switch-matrix module 7. The mating contacts 6 of the switch-matrix module 7 are arranged in a grid.

The contact points 3 of the circuit board 1 are arranged in a grid in the present case; but they may also vary from a grid. Furthermore, it is also not absolutely essential that the mating contacts 6 of the switch-matrix module 7 are arranged in a grid. The adapter 4 has the task of guaranteeing a terminal connection to the contact points 3 also when the contact points 3 and/or the mating contacts 6 lie outside the grid. In this case the test pins 5 extend in appropriately oblique manner within the three boards of the adapter 4.

The switch-matrix module 7 is connected to a test-voltage source 8 and also to a control circuit 9. The control circuit 9 controls the switch-matrix module 7 with a certain test clock pulse in such a way that test pins which are determined in consecutively alternating manner are connected to the test-voltage source 8. The test-voltage source 8 is, for its part, supplied with clock pulses by the control circuit in such a manner that it emits a test voltage only during a clock pulse and switches said test voltage off between the clock pulses. From the above description it follows that the switch-matrix module 7 is the realisation in terms of hardware of—expressed in general terms—variable connecting means, whereas the control circuit 9 is to be regarded as the realisation in terms of hardware of—described in general terms—program control means, whereby the connecting means are capable of being switched over by the program control means, in clock-pulsed manner in accordance with a certain test program, in such a way that the test-contact elements—here the test pins 5—can be connected individually or in groups to the test-voltage source 8.

With an evaluating circuit 10 which is likewise connected to the switch-matrix module 7 a measurement is then made as to whether a test current is flowing or not in the individual clock pulses. It goes without saying that, instead of the test current, another electrical parameter related thereto may also be measured.

The control circuit 9 operates in accordance with a certain test program (algorithm) inherent in it, by means of which it is possible to establish whether conductor tracks are interrupted (interruption fault) or whether a short-circuit to other conductor tracks is present (insulation fault).

With a view to establishing an interruption fault, in each case two test pins 5 have the test voltage of the test-voltage source 8 applied to them in succession, said two test pins 5 being selected in such a way that the conductor track 2 to be tested extends between the contact points 3 that are contacted by them. The test result (flow of current present or not) which is ascertained by the evaluating circuit 10 can, for example, be compared with the predetermined data of a master board. In the event of deviations from the predetermined data of the master board an interruption fault is present, the position of which can—if desired—be localized, since the positions of the contact points of the conductor track in question are known.

With a view to establishing an insulation fault, the test pins 5 that are connected to the contact points 4 of a conductor track 2—on the one hand—and the test pins 5 that are connected to the remaining contact points 3—on the other hand—have the test voltage of the test-voltage source 8 applied to them in succession. The test result which is ascertained by the evaluating circuit 10 is again compared with the data of the master board. In the event of a deviation an insulation fault is present. Here too—if desired—a localization of the fault can again be undertaken.

An essential aspect of the known test method that has been described in conjunction with FIG. 2 is that the contact points of the initial circuit board 1 are processed in succession. This means, for example, that the conductor track 2 of panel C extending between the contact points 3a and 3b is tested for interruption in the manner described above and that, after this, the same test is performed once more for the conductor track 2 that extends between the contact points 3a and 3b of panel D. Altogether, taking the initial circuit board 1 in FIG. 1 as a basis, the testing of the conductor track 2 extending between the test points 3a and 3b is performed four times in succession according to the state of the art.

Now, with the method according to the invention there is provision that testing of the four panels A, B, C and D for interruption of the conductor tracks and/or insulation of one conductor track in relation to others is effected in parallel, i.e. simultaneously. It is obvious that the testing-time in this case amounts to only one quarter of the testing-time required for a test in the conventional manner.

Figure 3:
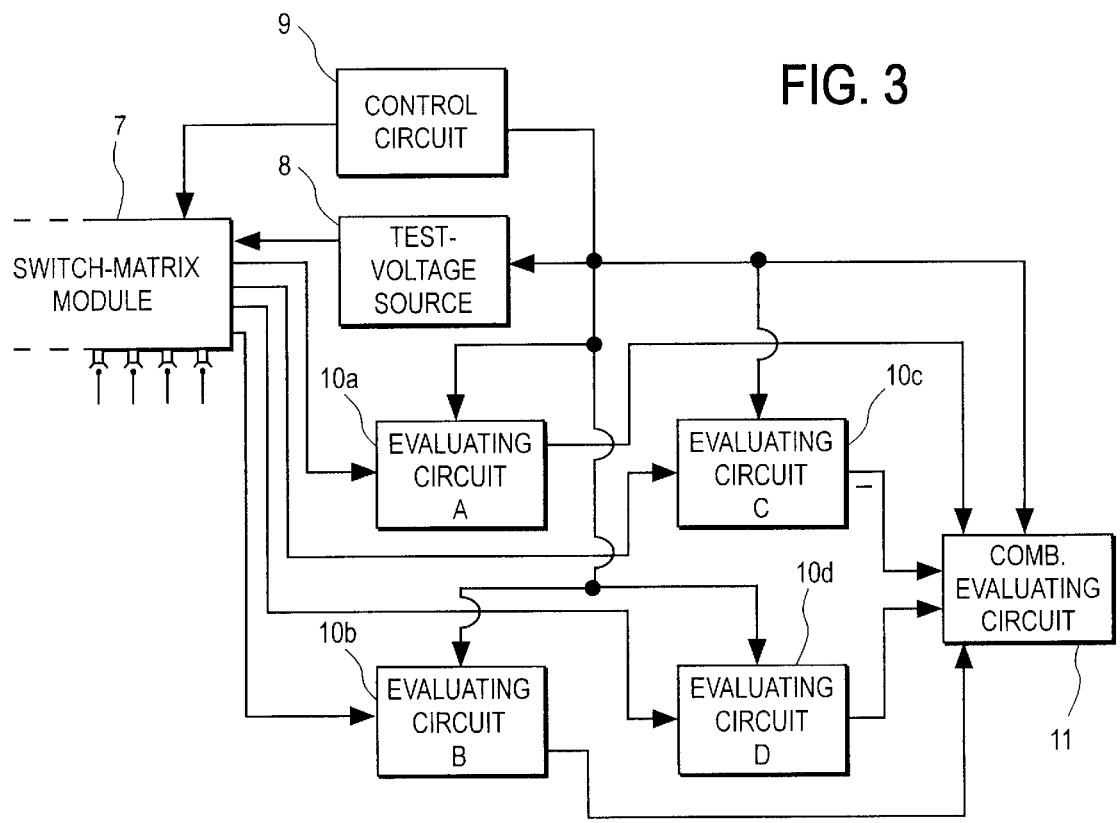
FIG. 3 a part of the testing device from FIG. 2 with circuit components that have been altered in accordance with the invention so that the test method according to the invention can be realised.

FIG. 3 shows schematically how the method according to the invention can be realised in terms of hardware. Since the components 1–7 from FIG. 2 are present in unaltered form also in the case of the testing device that has been configured in accordance with the invention, in FIG. 3 only a part of the unaltered switch-matrix module 7 and, apart from that, the new circuit components realising the invention are represented. The latter components are the four evaluating circuits 10a, 10b, 10c and 10d, each of which is connected to the switch-matrix module 7.

Evaluation of the testing of the four panels A, B, C and D is effected separately with these four evaluating circuits. The control circuit 9 again generates a test clock pulse and supplies clock pulses to the test-voltage source 8 as well as to the four evaluating circuits 10a–10d. In addition, the control circuit 9 controls the switch-matrix module 7 in accordance with an amended test program, specifically in such a way that, for example, the test pins in contact with test contacts 3a and 3b of the four panels A, B, C and D (eight altogether) have the test voltage generated by the test-voltage source 8 applied to them simultaneously, so that a current has to flow through the four conductor tracks 2. This flow of current is measured separately and in parallel by the four evaluating circuits 10a–10d. If an evaluating circuit measures no current then the conductor track 2 in question is interrupted.

The test result of the four evaluating circuits 10a–10d is then combined in a combinational evaluating circuit 11. In the latter the comparison with the data of the master board can then take place in parallel form. The combinational evaluating circuit 11 operates likewise according to a test clock pulse and to this end is in turn connected to the control circuit 9.

At this point let it be noted that the test program does not have to proceed in like manner for all test areas. Thus it is also possible that, in one test area, testing is firstly carried out for interruption faults and then for insulation faults, whereas the testing in another test area is carried out the other way round.

Figure 4:
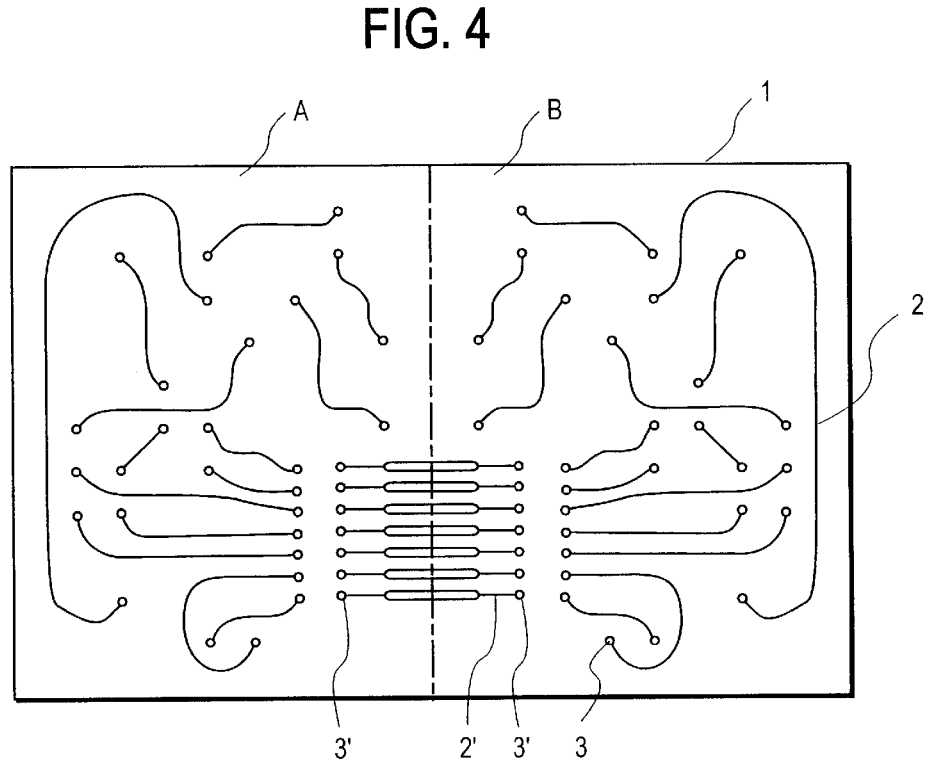
FIG. 4 the top view of another initial circuit board to be tested, with two panels but with area-overlapping conductor tracks.

In FIG. 4 an initial circuit board to be tested is shown, with test areas A, B each corresponding to a panel, wherein—diverging from the circuit board 1 in FIG. 1—area-overlapping conductor tracks 2' are provided. The latter constitute, for example after separation of the two panels, the connecting contacts for the connectors to be clipped into the conductor tracks 2' at the points in question. What is important here is that the test points 3' of the area-overlapping conductor tracks 2' situated in different test areas do not have test voltage applied to them simultaneously during the parallel testing, since this could lead to a false result. However, it is possible for such a requirement to be taken into account without any difficulty, by the test program being configured by an appropriate algorithm.

Figure 5:
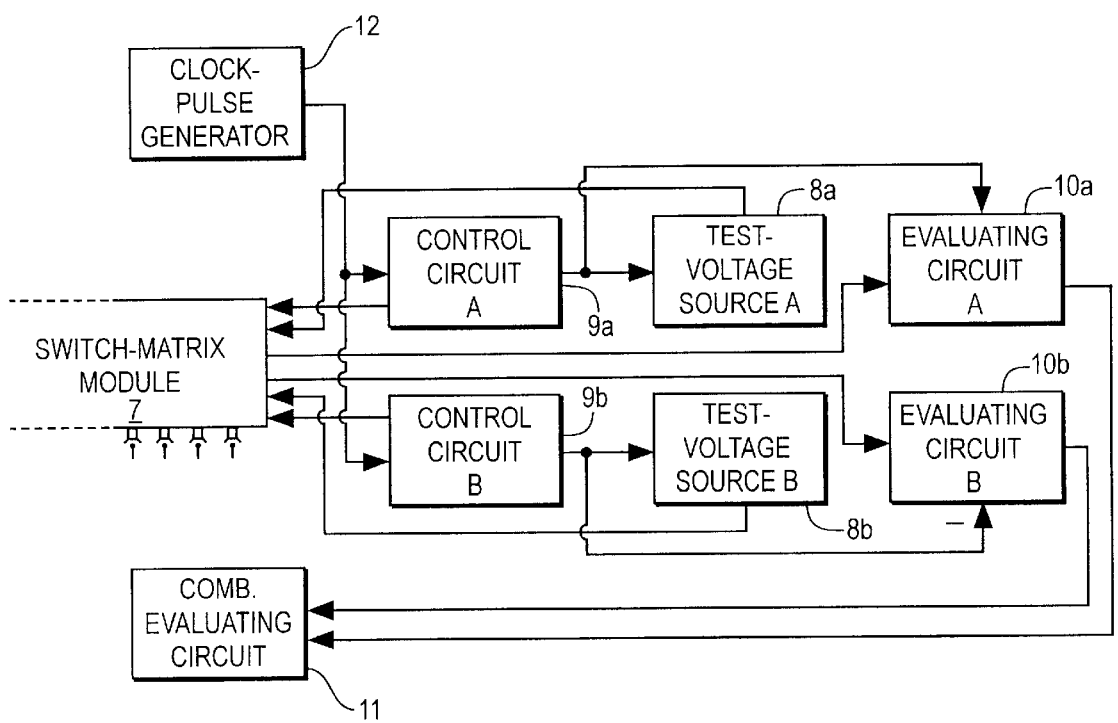
FIG. 5 a part of the testing device from FIG. 2, which is suitable for testing an initial circuit board according to FIG. 4 and which, in addition, is configured in a manner according to the invention as an alternative to FIG. 3.

FIG. 5 shows, again schematically, the components that are new in comparison with the known testing device according to FIG. 2, in order to be able to test the initial circuit board according to FIG. 4 using the method according to the invention. In order to be able to test the two test areas A and B in parallel, here not only is the evaluating circuit 10 provided in double configuration but the control circuit 9 and the test-voltage source 8 are also provided in duplicate.

The control circuit 9a, which contains the necessary test program, serves for testing test area A. The control circuit 9a controls a test-voltage source 8a, which in turn supplies test voltage to the switch-matrix module 7 at the appropriate cycle time. Switching-over of the appropriate switches for test area A in the switch-matrix module 7 is effected by the control circuit 9a, which to this end is connected to the switch-matrix module 7. By virtue of an appropriate connection the test result for test area A is supplied by the switch-matrix module 7 to the evaluating circuit 10a, which to this end is supplied with clock pulses by the control circuit 9a—likewise by virtue of an appropriate connection.

Test area B is, for its part, tested in analogous manner by the control circuit 9b, the test-voltage source 8b and the evaluating circuit 10b.

The two control circuits 9a and 9b are, for their part, controlled by a common clock-pulse generator 12 via appropriate connections.

The result of evaluation by the evaluating circuit 10a for test area A and the result of evaluation by the evaluating circuit 10b for test area B are supplied via appropriate connections to a combinational evaluating circuit 11 which is thereby able to register and optionally indicate interruption faults and insulation faults on the whole circuit board 1—independently of test area A or of test area B.

The application of the inventive idea of parallel testing to a testing device with a test area that is realised by several test modules arranged side by side, as disclosed in EP-B1 0 108 405 for example, will be elucidated in the following on the basis of FIGS. 6 to 13.

Figure 6:
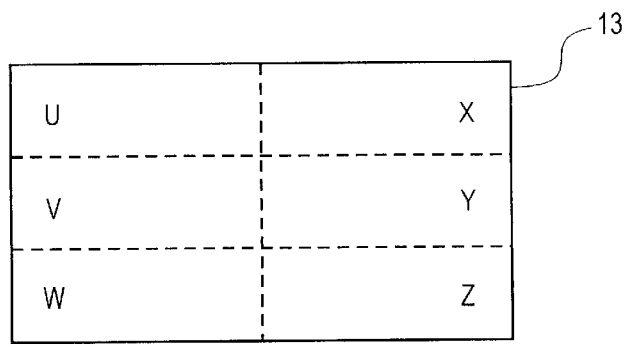
FIG. 6 a test bench composed of several autonomous test modules, in schematic representation.

In FIG. 6 a test bench 13 is represented schematically which is assembled from a total of six autonomous test modules U, V, W, X, Y and Z arranged side by side in two columns and three rows, which are operated in parallel and which form a rectangular test bench with six sub-benches. The switch-matrix module 7 of the above-mentioned embodiment examples is replaced in this case by the six test modules U–Z. Each test module has its own control circuit (not shown), its own source of test voltage (not shown) and its own evaluating circuits (not shown). Furthermore, a superordinate control-circuit component is preferably present which provides, in particular, for a simultaneous operation of testing the test modules U–Z and for any necessary reciprocal coordination of the test modules U–Z. In addition, a superordinate combined evaluating circuit is provided which registers and optionally indicates interruption faults and insulation faults in the whole test area 13.

Various application examples of such a test bench 13 which is composed of several autonomous test modules U–Z for the parallel testing of circuit boards are represented in the following in FIGS. 7 to 13.

Figure 7:
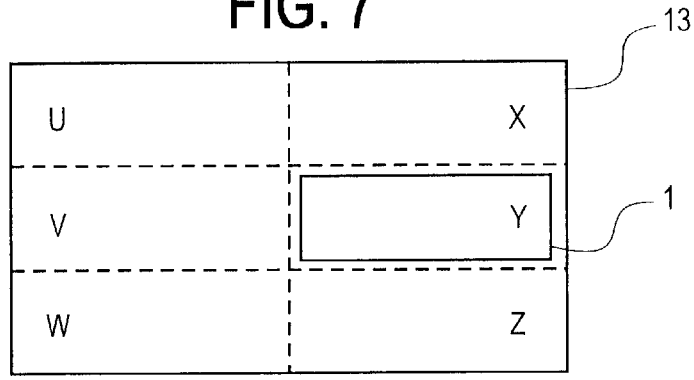
FIGS. 7 to 13 various application examples for the test bench of FIG. 6 which is composed of several test modules, in schematic representation.

FIG. 7 shows, firstly, the case of the testing of an individual circuit board 1 which covers only one sub-bench Y of the test bench 13. In this application no gain of time is achieved in comparison with the structure of the test bench 13 consisting of only one module, since the remaining five autonomous test modules U–X and Z do not intervene in the testing operation.

Figure 8:
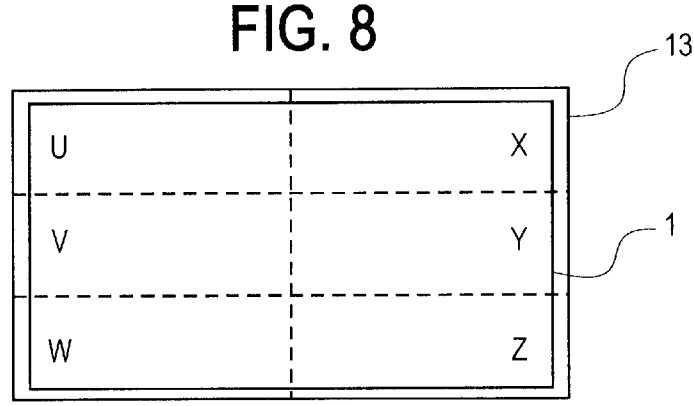

In the application example of FIG. 8 a circuit board 1 which covers the entire test bench 13 is placed onto the test bench 13, whereby the circuit board 1 does not consist of several panels but, instead, the conductor tracks extend over the entire circuit board 1. By reason of the conductor tracks on the circuit board 1 which overlap the sub-benches U–Z, only a relatively small gain of time is achieved in comparison with the structure of the test bench 13 consisting of only one module.

Figure 9:
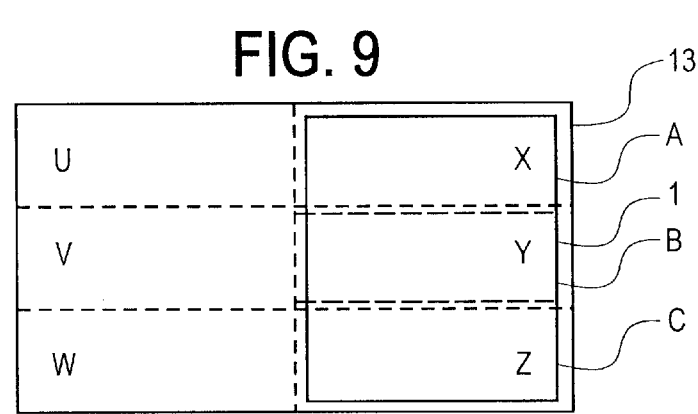

If, on the other hand, as shown in FIG. 9, a circuit board 1 is to be tested that covers the three sub-benches X–Z of one column of the test bench 13 and contains three panels A, B, C which are assigned locally to the sub-benches X, Y, Z, then in comparison with the structure of the test bench 13 consisting of only one module a gain of time by a factor of 3 results, because the three panels A, B, C of the circuit board 1 are tested in parallel.

Figure 10:
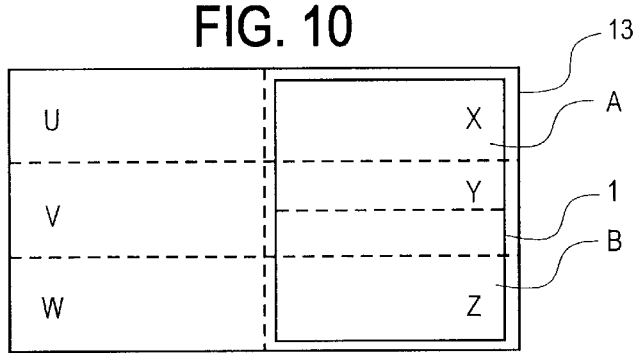

If, for example, a circuit board 1 is to be tested that likewise extends over the column of the test bench 13 constituted by three sub-benches X–Z and contains two panels A, B, each of which encroaches into the central sub-bench Y, as represented in FIG. 10, then in comparison with the structure of the test bench 13 consisting of only one module a gain of time is achieved which, though smaller than the gain of time by a factor of 3 (FIG. 9) which is described above, is greater than a factor of 1, so that the parallel testing is advantageous also in this case.

Figure 11:
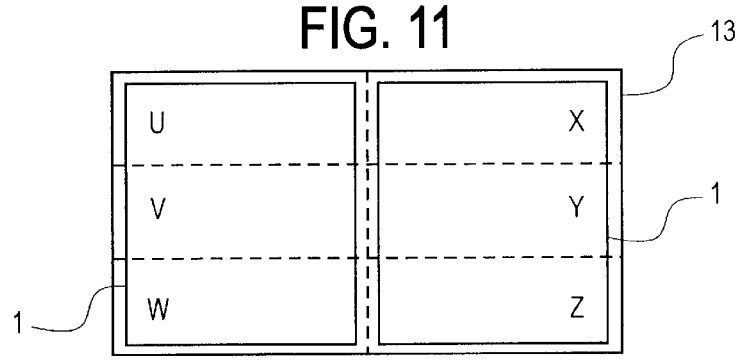

Furthermore, as shown in FIG. 11, two circuit boards 1 which are identical but separate from one another, each of which covers one column of the test bench 13 with three sub-benches U–W and X–Z, respectively, can be tested in parallel. If—in the case where identical test modules U–W and X–Z are employed—all the contact points 3 or conductor tracks 2 of each circuit board 1 are tested, then here too a corresponding gain of time can be achieved.

Figure 12:
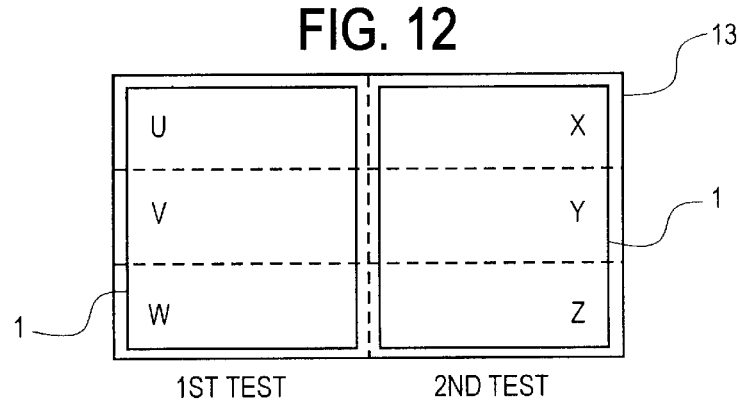

In continuation of the application example of FIG. 11, the two identical circuit boards 1 can also be tested in two test phases following one another, as represented schematically in FIG. 12. In the first test phase a first partial number of the conductor tracks 2 (and contact points 3) of the first circuit board 1 are tested by the first column U–W of the test bench 13. In the second test phase, which is carried out in parallel, a second partial number of the conductor tracks 2 (and contact points 3) of the second circuit board 1 are tested by the second column X–Z of the test bench 13, whereby the conductor tracks 2 of the first partial number and those of the second partial number are different and whereby the two partial numbers of the conductor tracks 2 comprise all the conductor tracks 2 of the circuit boards 1. Subsequently the two circuit boards 1 are exchanged and the first circuit board 1 passes through the second test phase of the second column X–Z and the second circuit board 1 passes through the first test phase of the first column U–W.

Another possibility, following the example of FIG. 12, is that the circuit boards 1 are tested in accordance with a type of assembly-line process. This means that the first test computer with six sub-benches U–Z is adjoined by a further test computer with six sub-benches U–Z, so that the 10 two partial numbers of the conductor tracks 1 are tested in different test computers. Here too a considerable gain of time can be achieved.

Figure 13:
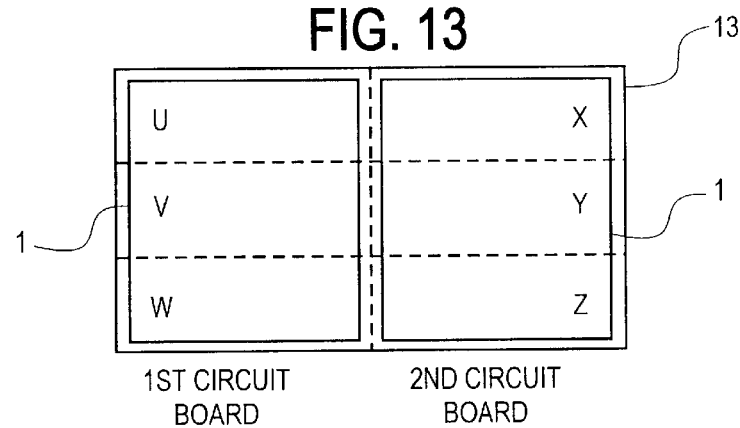

A further application example which may be given is that as shown in FIG. 13—two different circuit boards 1, each of which has the size of one column of the test bench 13, are tested simultaneously in a test computer. In this case different adapters for the two columns U–W and X–Z of the test bench 13 have to be employed in certain circumstances.

Furthermore, the increasing packing of the contact points 3 on the circuit boards 1 makes it increasingly difficult to bring contact points 3 situated side by side into contact with test pins 5 simultaneously. In order nevertheless to be able to perform a test of contact points 3 situated side by side in tightly packed manner it has already been proposed to contact these several contact points 3 by means of a test surface jointly covering and short-circuiting said contact points. At least one of the jointly covered contact points 3 should then be capable of being reached via a conductor track 2 from a contact point 3 of the circuit board 1 that lies outside the stated test surface. This type of testing—known as such—also contributes, in connection with the inventive concept of parallel testing, to achieving a gain of time.

The application examples described above are only an exemplary selection of possible applications. A person skilled in the art will readily discover additional applications, possibly also in the form of combinations of those elucidated above, for parallel testing with several autonomous test modules. The application is also not restricted to a test bench with six test modules.

What is claimed is:

1. A method of testing a printed circuit board comprising a plurality of identical basic patterns or panels of conductor tracks, said method comprising the steps of:
   (a) contacting at least two of the basic patterns or panels of the circuit board with conducting test contact elements at contact points connected to the conductor tracks;
   (b) connecting in succession in a clock-pulsed manner according to a test program and in parallel test contact elements of said at least two basic patterns or panels to a test voltage source, and,
   (c) measuring the test current flowing via the test contact elements or a parameter related thereto during each test clock pulse.

2. A device for testing a printed circuit board comprising a plurality of identical basic patterns or panels of conductor tracks, said circuit board having contact points connected to the conductor tracks, said device comprising:
- (a) a plurality of test contact elements for contacting said contact points,
- (b) a test voltage source,
- (c) program control means,
- (d) variable connecting means that can be switched over by the program control means to connect the test contact elements individually or in groups to the test voltage source in succession in a clock-pulsed manner according to a test program, and
- (e) a plurality of evaluating means that measure and evaluate a flow of current through the test contact means in a parameter related thereto, for parallel testing of at least two of the basic patterns or panels.

3. The device of claim 2 comprising a plurality of test voltage sources and a plurality of program control means.

4. A device for testing a printed circuit board comprising a plurality of identical basic patterns or panels of conductor tracks, said circuit board having contact points connected to the conductor tracks, said device comprising:
- (a) a plurality of test modules arranged side by side each other, and
- (b) a plurality of test contact elements connected to said test modules and connectable to said contact points in accordance with a test program such that the test modules can test the basic patterns or panels associated with the respective test modules simultaneously and independently of one another.

* * * * *